United States Patent [19]

Kweon

[11] Patent Number: 5,144,376
[45] Date of Patent: Sep. 1, 1992

[54] COMPOUND SEMICONDUCTOR DEVICE

[75] Inventor: Ki-young Kweon, Seoul, Rep. of Korea

[73] Assignee: Samsung Electronics Co., Ltd., Kyunggi, Rep. of Korea

[21] Appl. No.: 697,685

[22] Filed: May 9, 1991

[30] Foreign Application Priority Data

Aug. 21, 1990 [KR] Rep. of Korea ............... 90-12882

[51] Int. Cl.$^5$ .................. H01L 29/73; H01L 29/203
[52] U.S. Cl. ........................ 357/16; 357/34; 357/56
[58] Field of Search ............ 357/16, 34, 55, 56

[56] References Cited

FOREIGN PATENT DOCUMENTS 184016 6/1986 European Pat. Off. ........ 357/34 HB
300803 1/1989 European Pat. Off. ........ 357/34 HB Primary Examiner—William D. Larkins
Attorney, Agent, or Firm—Cushman, Darby & Cushman

[57] ABSTRACT

A compound semiconductor device includes a semi-insulating substrate having a mesa structure defined by recess-etched portions along each side. A collector layer, base layer, emitter layer, and an emitter contact layer are formed sequentially on the recess-etched portions and on the mesa structure. As a result, the collector layer of the mesa structure and the emitter contact layer of the recess portions are horizontally self-aligned to form a collector. Further, the base layer of the mesa structure and a base contact layer formed on the emitter contact layer of the recess portions are horizontally self-aligned to form a base.

5 Claims, 3 Drawing Sheets

COMPOUND SEMICONDUCTOR DEVICE

BACKGROUND OF THE INVENTION

2. Field of the Invention

The present invention relates to a compound semiconductor device, and more particularly to a heterojunction bipolar transistor (hereinafter referred to as HBT).

2. Description of the Art

As a result of the progress of crystal growth techniques, such as a molecular beam epitaxy (hereinafter referred to as MBE) method and a metal organic chemical vapor deposition (hereinafter referred to as MOCVD) method, the development of semiconductor devices utilizing heterojunctions is being pursued. A heterojunction device is formed by joining semiconductor materials which are different from each other.

For example, a HBT is a semiconductor device which utilizes a heterojunction between an emitter and a base of a bipolar transistor. The aforesaid HBT has several advantages as compared with a conventional homojunction bipolar transistor, which is formed by using a single semiconductor material.

First, the semiconductor material constituting the emitter layer has an energy gap wider than that of the semiconductor material constituting the base layer. Therefore, the impurity concentrations of the emitter and base regions may be set independently without lowering the efficiency of the emitter injection.

Further, the base resistance may be decreased. The base layer may be formed less thick since the impurity concentration of the base layer can be increased. In addition, since the impurity concentration of the collector layer can also be reduced, the collector capacitance thereof may be reduced accordingly.

Because of the above advantages, the HBT achieves superior performance in the high frequency and switching characteristics compared with the conventional homojunction bipolar transistor.

FIG. 1 is a sectional view of the conventional HBT having a semi-insulating GaAs substrate 1, an N+type GaAs collector contact layer 2, an N type GaAs collector layer 3, a P+type GaAs base layer 4, an N type AlGaAs emitter layer 7, an N+type GaAs emitter contact layer 9, an emitter electrode 10, a base electrode 11, and a collector electrode 12.

A HBT, constructed as above, has a limitation in that the base resistance cannot be reduced beyond a certain level, even though the impurity concentration of the base layer is high, because the base layer is thin.

To decrease the base resistance, a built-in field may be formed by varying the material content of the base layer. For example, $Al_xGa_{1-x}A_s$ may be used as the material of the base layer, where the value of x decreases when moving from the emitter layer to the base layer. The carrier mobility in the base region is increased by the built-in field and thus, the time for the carrier to pass the base layer is decreased, so that the base layer can be formed more thick. However, this method still has a limitation in reducing the base resistance.

Furthermore, in the above HBT, the collector capacitance is reduced by etching a portion of the base and collector layers and thus decreasing the junction area between the base and the collector layers. But, a large capacitance still exists, thereby impeding high speed operation at high frequencies.

FIG. 2 illustrates another kind of HBT which has graded layers 6 and 8 grown according to an MBE method so that the concentration of aluminum component changes gradually to remove a steep potential barrier occurring due to the heterojunction in the HBT shown in FIG. 1. The HBT shown in FIG. 2 has an enhanced current gain compared with that shown in FIG. 1 due to a gentle potential barrier in the heterojunction.

However, this HBT also has the same disadvantage as that of the HBT shown in FIG. 1 including a high base resistance and a large collector capacitance.

The same reference numerals are used in FIGS. ; and 2 to designate the same parts. Grade layer 6 is interposed between P+type GaAs base layer 4 and N type AlGaAs emitter layer 7, and the aluminum concentration thereof varies gradually so that layer 6 has an N-type GaAs formation near base layer 4 and N+type AlGaAs formation near emitted layer 7. Graded layer 8 is interposed between N type AlGaAs layer 7 and N+type GaAs contact layer 9 and the aluminum concentration thereof varied gradually so that layer 8 has an N type AlGaAs formation near layer 7 and an N+type GaAs formation near layer 9.

Undoped GaAs spacer 5 is interposed between graded layer 6 and base layer 4, and prevents an impurity contained in the base layer from diffusing into graded layer 6 when the graded layer is formed. (In the case of a P+type GaAs base layer, the impurity includes $Mg^+$ or $Be^+$.

SUMMARY OF THE INVENTION

Therefore, an object of the present invention is to provide a HBT in which the base resistance is reduced to thicken the base layers except those contacting the emitter layer, thereby obviating the problems encountered in the conventional devices.

Another object of the present invention is to provide a HBT which reduces the collector capacitance by interposing a barrier layer between the base and collector layers.

For achieving the first and second objects of the present invention, a compound semiconductor device comprises:

a semi-insulating substrate having a forward mesa structure surrounded by a recess-etched portion of a predetermined depth;

collector contact layer formed on the semiinsulating substrate and made of a first compound semiconductor highly doped with a first conductivity type impurity;

collector layer formed on the collector contact layer and made of the first compound semiconductor doped with the first conductivity type impurity having a density lower than that of the first impurity of the collector contact layer;

base layer formed on the collector layer and made of the first compound semiconductor highly doped with a second conductivity type impurity;

emitter layer formed on the base layer and made of a second compound semiconductor having an energy band gap wider than that of the first compound semiconductor, and doped with the first conductivity type impurity;

emitter contact layer formed on the emitter layer and made of the first compound semiconductor highly doped with said first conductivity type impurity, and a side portion of the emitter contact layer on the recess-etched portion contacting a side portion of the collector contact layer and a side portion of the collector layer on the mesa structure; and base contact layer formed on the emitter contact layer on the recess-etched portion, made of a first compound semiconductor highly doped with the second conductivity type impurity, being thicker than the base layer, and a side portion of the base contact layer on the recess-etched portion contacting a side portion of said base layer on the mesa structure.

To achieve the third object, the compound semiconductor device of the present invention comprises a first and a second barrier layer which are interposed between the emitter contact layer and the base contact layer and are of different impurity types.

BRIEF DESCRIPTION OF THE DRAWINGS

For the detailed description of the preferred embodiments of the present invention presented below, reference is made to the accompanying drawings in which.

DETAILED DESCRIPTION OF THE INVENTION

Figure 1:
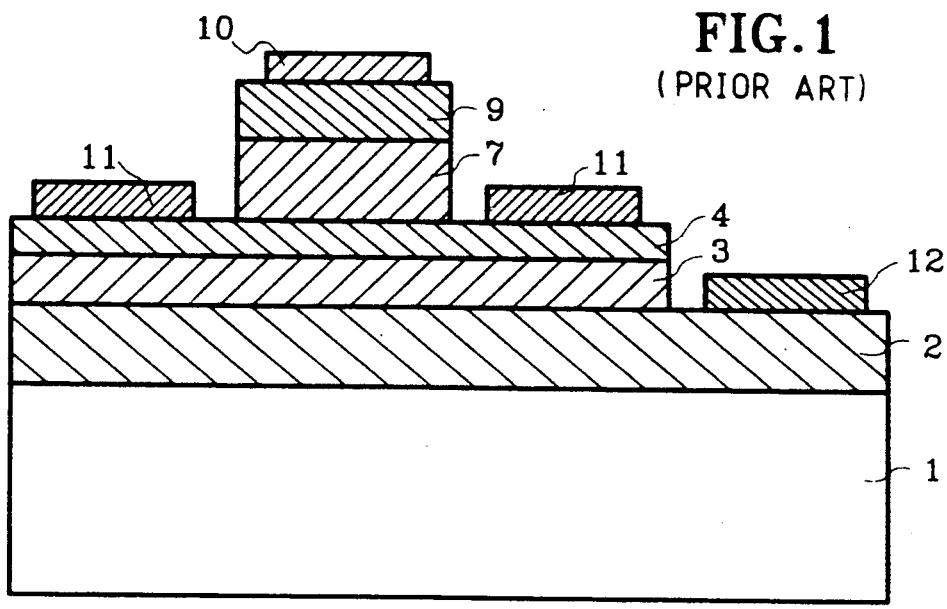
FIG. 1 and FIG. 2 illustrate the structures of conventional HBTs.
Figure 3:
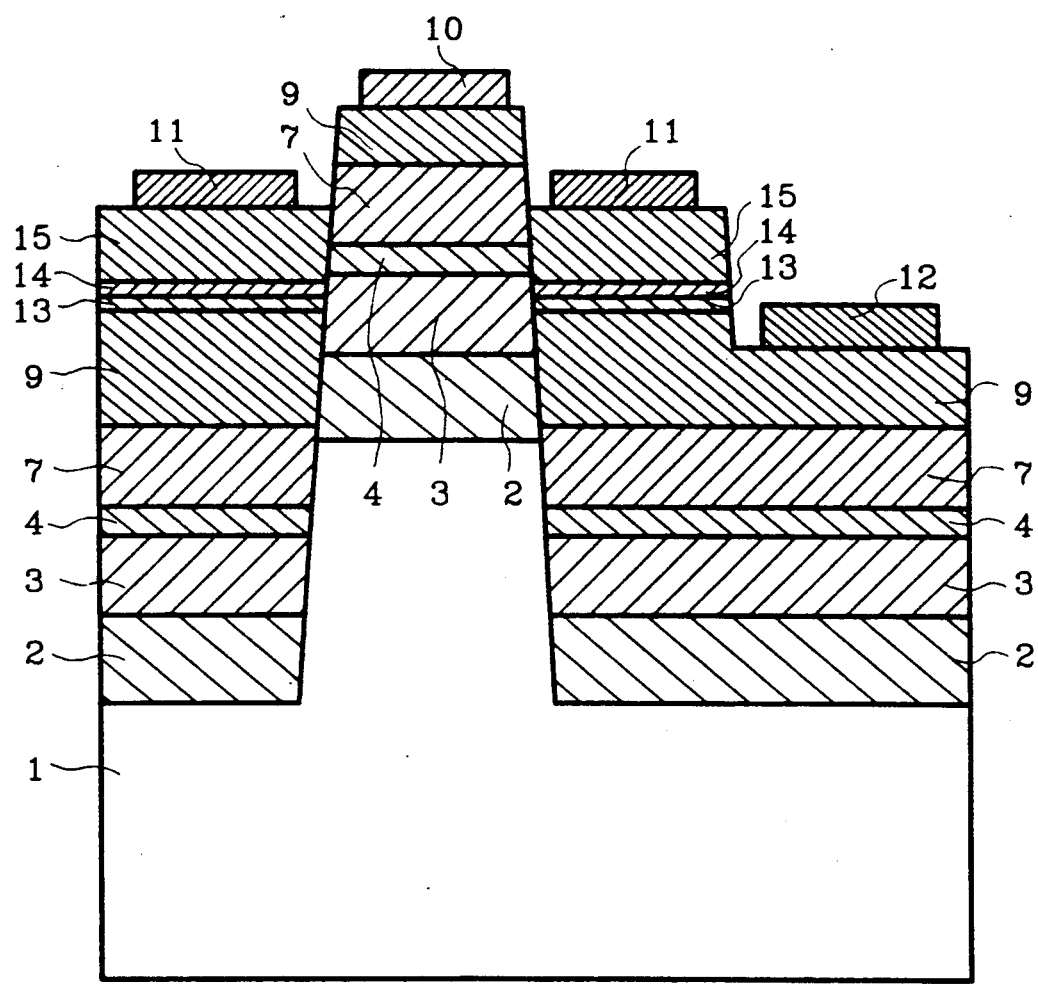
FIG. 3 illustrates one embodiment of an HBT according to the present invention.

The same reference numerals are used in FIGS. 1 and 3 to designate like parts.

In addition to the layers discussed with reference to FIG. 1, the HBT shown in FIG. 3 includes a barrier layer a barrier layer 13 contacting an N+type GaAs collector layer 9, a barrier layer 14 contacting a P+type GaAs base contact layer 15, and P+type GaAs base contact layer 15. The impurities of barrier layers 13 and 14 are of differing types.

In the HBT according to the present invention as shown in FIG. 3, all the semiconductor layers constituting the HBT are formed on the semiinsulating substrate 1 having a mesa structure by a crystal growth method, such as MBE or MOCVD or MOMBE. The mesa-shaped substrate is provided so that a high density collector layer 2 in the mesa structure portion and a high density contact layer 9 in the recess structure portion (on both sides of the mesa structure portion) can be horizontally self-aligned to form a collector. Further, a base layer 4, having high density in the mesa structure portion, and a base contact layer 15, having a high density in the recess structure portion, are horizontally self-aligned to form a base.

At this time, the horizontal self-alignment can be obtained by controlling the height of the mesa when a semi-insulating substrate 1 is etched to have the mesa structure If semiconductor layers such as 1, 2, 3, 4, 7, 9, 13, 14, and 15 in FIG. 3 are grown on semi-insulating substrate 1 which includes a mesa structure, the same layers are grown both in the mesa structure portion and in the recess structure portion of the substrate (which is not shown in the drawings). After growing layers 13, 14 and 15 in the mesa and recess structures, those layers grown in the mesa are removed using a conventional etching process exposing the high density emitter contact layer 9 of the mesa structure. Thereafter, electrode 10 is formed on the exposed layer 9. When forming collector layer 2 in the mesa structure, layer 2 in the recess structure portion is simultaneously formed to control the height of layer 9 in the recess structure so that the collector contact layer 2 in the mesa structure and the emitter contact layer 9 in the recess structure can be aligned horizontally.

Figure 4:
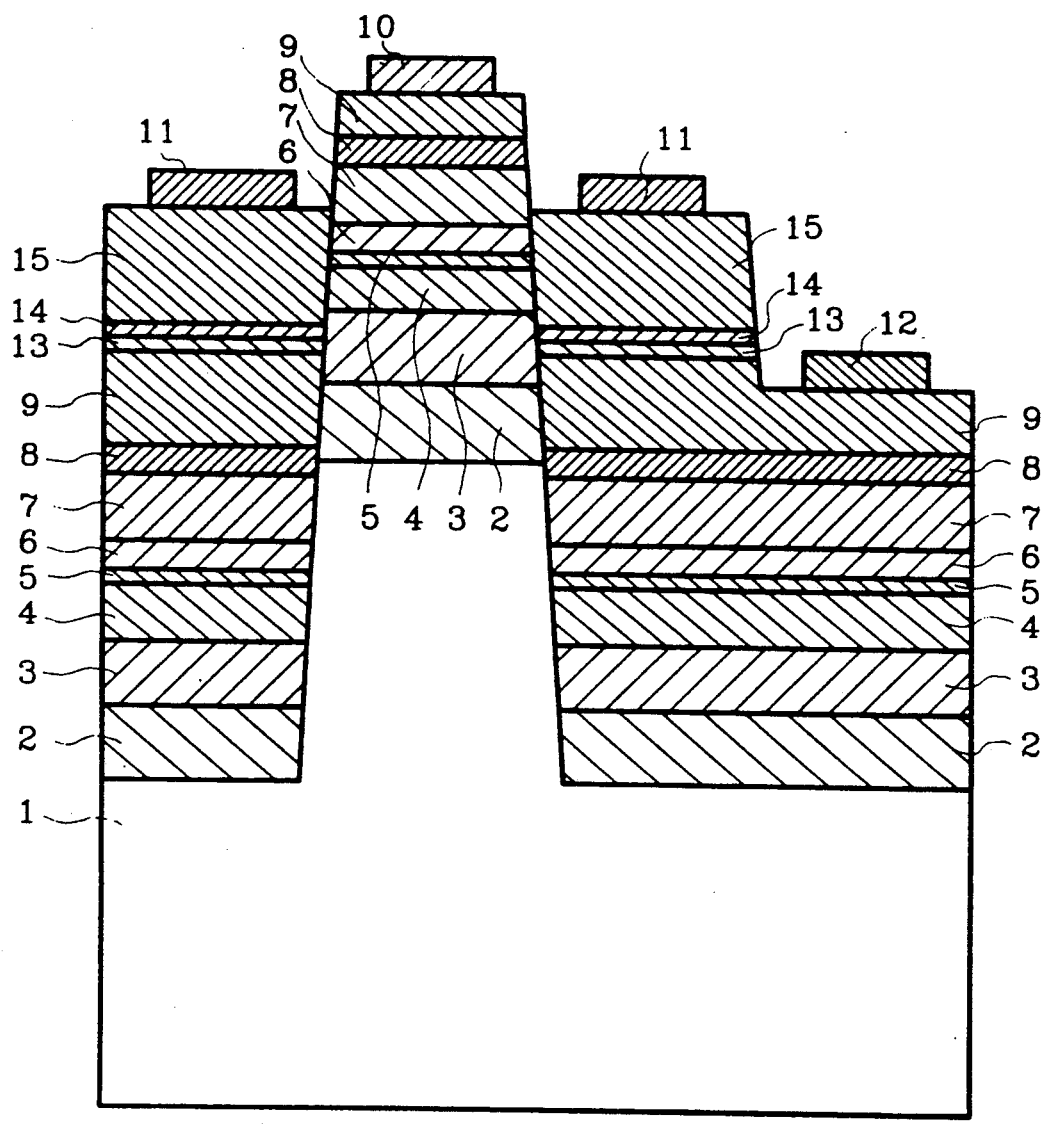
FIG. 4 illustrates another embodiment of an HBT according to the present invention.

FIG. 4 shows a sectional view of another embodiment of a HBT according to the present invention.

Figure 2:
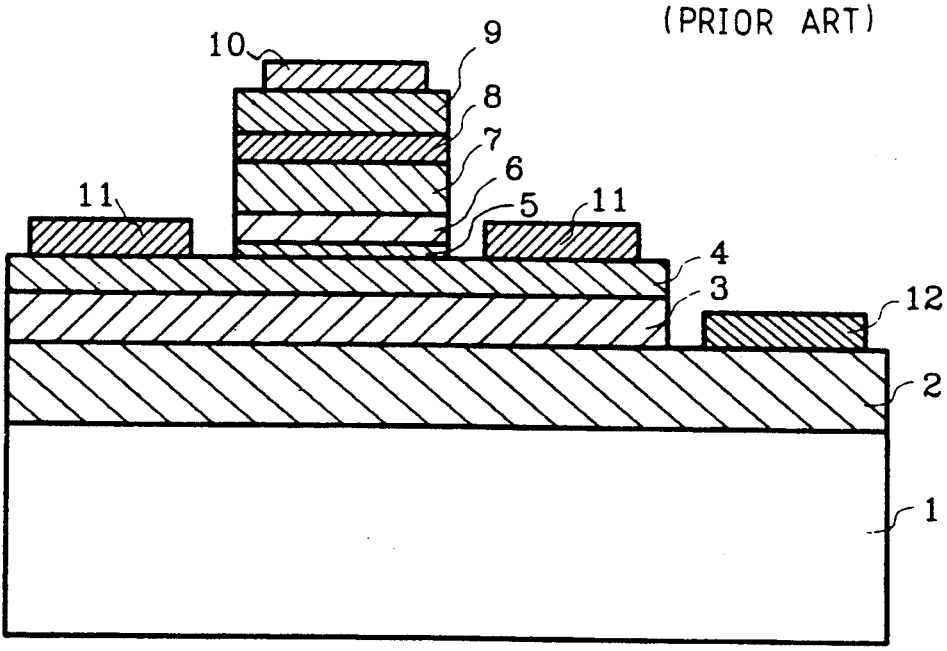

The same reference numerals are used in FIG. 4 to designate the same parts as those discussed with respect to FIGS. 1-3. Unlike the HBT shown in FIG. 3, the HBT shown in FIG. 4 includes the graded layers 6 and 8 and the spacer 5.

In the HBT structure of the present invention (as shown in FIGS. 3 and 4), the base region is composed of the base layer 4 in the mesa structure which contacts emitter layer 7 in the mesa structure of FIG. 3 or with spacer 5 in the mesa structure of FIG. 4, and base contact layer 15 which contacts with emitter layer 7 of FIG. 3 or with graded layer 6 and emitter layer 7 of FIG. 4, as well as base electrode 11. The thickness of base layer 4 in the mesa structure contacting with emitter layer 7 or with spacer 5 is formed thin, whereby the device may perform well at the high frequency in the same manner as in the prior art. But, the base layer 15 contacting the base electrode 11 is formed thick and with high density by utilizing crystal growth, so that the overall base resistance may be decreased.

In addition, by growing the barrier layers 13 and 14 having different type of impurities between the high density base contact layer 15 and the high density collector layer 9 in the recess structure portion, the collector junction capacitance between base contact layer 15 and collector contact layer 9.

If first and second barrier layers 13 and 14 between collector contact layer 9 and base contact layer 15 are grown so that they are of a different type than adjacent layers thereof, series junction capacitances are formed between collector contact layer 9 and first barrier layer 13, between first barrier layer 13 and second barrier layer 14, and between second barrier layer 14 and base contact layer 15. The overall junction capacitance thus formed is less than the junction capacitance between base contact layer 15 and collector contact layer 9 formed in the absence of the above barrier layers. Layer 9 serves not only as an N type GaAs emitter contact layer but also as an N+type GaAs collector layer which is in contact with collector electrode 12, as shown in FIGS. 3 and 4.

An HBT according to the present invention has at least three advantages. First, the HBT performs well at high frequencies due to the thin base layer 4 formed in the mesa structure. Second, the base resistance is reduced due to the thick base contact layer 15. Third, the base-collector junction capacitance formed between base contact layer 15 and collector contact layer 9 is reduced due to the barrier layers 13 and 14. As a result, the HBT operates at high speed.

In the above description, the barriers are disclosed for decreasing the junction capacitance between base and collector, but low density semiconductor layers having different impurities may be used alternatively.

Furthermore, the invention has been described in detail with respect to an NPN type HBT, but the invention is also applicable to a PNP type HBT.

What is claimed is:

1. A semiconductor device comprising:

a semi-insulating substrate having a mesa structure region surrounded by a recessed region, the recessed region being formed at a predetermined depth below the mesa structure region, with side walls extending from the recessed region to the mesa structure region;

a collector contact layer of a first semiconductor material formed over the mesa structure region and the recessed region, but not over the side walls, said collector contact layer being highly doped with a first conductivity type impurity;

a collector layer of the first semiconductor material formed on said collector contact layer and overlapping the mesa structure region and the recessed region but not the side walls, said collector layer being doped with said first conductivity type impurity and having a density lower than a density of said first impurity of said collector contact layer;

a base layer of the first semiconductor material formed on said collector layer and overlapping the mesa structure region and the recessed region but not the side walls, said base layer being highly doped with a second conductivity type impurity;

an emitter layer of a second semiconductor material formed on said base layer and overlapping the mesa structure region and the recessed region but not the side walls, said second semiconductor material having an energy band gap wider than that of said first semiconductor material, said emitter layer being doped with said first conductivity type impurity;

an emitter contact layer of the first semiconductor material formed on said emitter layer and overlapping the mesa structure region and the recessed region, said emitter contact layer being highly doped with said first conductivity type impurity, a first portion of said emitter contact layer which overlaps the recessed region making contact with a portion of said collector contact layer which overlaps the mesa structure region, and a second portion of said emitter contact layer which overlaps said recessed region making contact with a portion of said collector layer which overlaps said mesa structure region, said first portion of said emitter contact layer and said second portion of said emitter contact layer being separated from each other in the area of said side walls; and a base contact layer of the first semiconductor material formed over said emitter contact layer only overlapping said recessed structure portion, said base contact layer being highly doped with said second conductivity type impurity, and being formed thicker than said base layer, said base contact layer making contact with said base layer overlapping said mesa structure region.

2. The semiconductor device of claim 1, further comprising a first barrier layer made of said second semiconductor material doped with a first conductivity type impurity and formed on said emitter layer overlapping only said recessed region, and a second barrier layer made of said second semiconductor material and doped with a second conductivity type impurity formed on said first barrier layer, said first and second barrier layers defining a barrier layer pair disposed below said base contact layer.

3. The semiconductor device of claim 2, further comprising at least two barrier layer paris.

4. The semiconductor device of claim 1, wherein said first semiconductor material is GaAs and said second semiconductor material is AlGaAs.

5. The semiconductor device of claim 1, wherein said first conductivity type impurity is an N-type carrier impurity and said second conductivity type impurity is a P-type carrier impurity.

* * * * *